(12) United States Patent
Yeh et al.

(10) Patent No.: US 8,664,022 B2
(45) Date of Patent: Mar. 4, 2014

(54) SUBMOUNT FOR LIGHT EMITTING DIODE AND METHOD FOR FABRICATING THE SAME

(75) Inventors: Le-Sheng Yeh, Hsinchu (TW); Cheng-I Chien, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 88 days.

(21) Appl. No.: 13/411,638

(22) Filed: Mar. 5, 2012

(65) Prior Publication Data
US 2013/0126923 A1    May 23, 2013

(30) Foreign Application Priority Data
Nov. 17, 2011    (TW) ............... 100142007 A

(51) Int. Cl.
| H01L 21/00 | (2006.01) |
|---|---|
| H01L 21/311 | (2006.01) |
| C23F 1/00 | (2006.01) |
| B29D 11/00 | (2006.01) |
| B23P 15/00 | (2006.01) |
| C25F 3/00 | (2006.01) |

(52) U.S. Cl.
USPC .............. 438/29; 438/42; 438/43; 438/694; 216/2; 216/24; 216/39; 216/99

(58) Field of Classification Search
USPC .............. 438/29, 42, 43, 694, 700–703, 705, 438/735, 736, 743, 745, 749, 750, 751, 756, 438/765, 770; 257/E33.055, E33.056, 257/E33.057, E33.058, E25.022, E23.003, 257/E23.004, E23.18, E23.181, E23.183; 216/2, 24, 39, 96, 97, 99
See application file for complete search history.

(56) References Cited

U.S. PATENT DOCUMENTS

2010/0276720 A1 * 11/2010 MacElwee et al. ............. 257/98

FOREIGN PATENT DOCUMENTS

JP      57089259 A * 6/1982

* cited by examiner

*Primary Examiner* — Julio J Maldonado
*Assistant Examiner* — Cory Eskridge
(74) *Attorney, Agent, or Firm* — Jianq Chyun IP Office

(57) ABSTRACT

A submount for a light emitting diode and a method for fabricating the same are provided. The method includes the following steps: (a) providing a silicon substrate; (b) forming a mask layer on the silicon substrate to expose a part of the silicon substrate; (c) forming a first silicon oxide layer in the part of the silicon substrate which is exposed; and (d) removing the mask layer and the first silicon oxide layer, so as to form a recess in the silicon substrate.

14 Claims, 7 Drawing Sheets

SUBMOUNT FOR LIGHT EMITTING DIODE AND METHOD FOR FABRICATING THE SAME

CROSS-REFERENCE TO RELATED APPLICATION

This application claims the priority benefit of Taiwan application serial no. 100142007, filed Nov. 17, 2011. The entirety of the above-mentioned patent application is hereby incorporated by reference herein and made a part of this specification.

BACKGROUND OF THE INVENTION

1. Field of the Invention

The present invention generally relates to a silicon submount and a method for fabricating the same, and more particularly to a submount for a light emitting diode (LED) applicable to LED packaging and a method for fabricating the same.

2. Description of Related Art

An LED is a light-emitting element fabricated by a compound semiconductor, wherein electrons and holes in the semiconductor material combine and release energy, and the electrical energy is converted into the form of a light to be emitted. The LED is a cold light source and has the advantages such as low power consumption, no bulb warming up time, a long use life, a low driving voltage, and a high reaction speed, and together with the small volume, impact resistance and suitable for mass production, the LED may be easily fabricated into miniature or array devices in accordance with the application requirements. Therefore, the LED is usually used as the light-emitting element applied in a variety of electrical appliances, information bulletin board and communication products.

Generally speaking, in the LED package structure, an LED chip is configured in a recess of the submount. In an ideal situation, if photons generated by the LED chip can be completely radiated to the outside, the light-emitting efficiency is very high. However, in practice, the photons generated by the LED chip cannot be completely propagated to the outside due to various loss mechanisms. To achieve a wider application and prospect of the LED in the future, it has become one of the focused researches in many fields how to improve the light-emitting luminance and efficiency of the LED.

SUMMARY OF THE INVENTION

A submount for an LED and a method for fabricating the same are introduced herein, which may be used to form a recess with a required design in a silicon substrate without being limited to a lattice direction.

The method for fabricating a submount for an LED includes the following steps: (a) providing a silicon substrate; (b) forming a mask layer on the silicon substrate to expose a part of the silicon substrate; (c) forming a first silicon oxide layer in the part of the silicon substrate which is exposed; and (d) removing the mask layer and the first silicon oxide layer, so as to form a recess in the silicon substrate.

In an embodiment of the present invention, the mask layer includes a pad oxide layer and a silicon nitride layer, wherein the pad oxide layer is formed between the silicon substrate and the silicon nitride layer.

In an embodiment of the present invention, a slope or a curvature of a sidewall of the recess is adjusted by controlling a thicknesses ratio between the pad oxide layer and the silicon nitride layer.

In an embodiment of the present invention, the step (d) includes removing the silicon nitride layer and removing the pad oxide layer and the first silicon oxide layer.

In an embodiment of the present invention, after the step (d), the method further includes repeating the step (b) to the step (d) at least once.

In an embodiment of the present invention, when the step (b) is repeated, a range of the part of the silicon substrate exposed by the mask layer is substantially identical to a range of the part of the silicon substrate exposed by the mask layer in the step (b) that is performed last time.

In an embodiment of the present invention, when the step (b) is repeated, the range of the part of the silicon substrate exposed by the mask layer contracts towards a center of the recess as compared with the range of the part of the silicon substrate exposed by the mask layer in the step (b) that is performed last time.

In an embodiment of the present invention, the step (c) includes performing a thermal oxidation process to oxidize the silicon substrate that is not covered by the mask layer.

In an embodiment of the present invention, after the step (d), the method further includes: performing an ion implantation process to form a plurality of implantation regions in a part of the sidewall of the recess; performing a thermal process to form a plurality of second silicon oxide layers in the implantation regions; and removing the second silicon oxide layers to form a plurality of holes on the sidewall of the recess.

In an embodiment of the present invention, the ion implantation process includes an oxygen ion implantation process.

In an embodiment of the present invention, the thermal process includes an oxygen-free thermal process.

In an embodiment of the present invention, after the step (d), the method further includes forming a planar surface at a bottom of the recess.

In an embodiment of the present invention, after the step (d), the method further includes forming a reflective layer on a surface of the silicon substrate in a conformal manner.

A submount for an LED is further provided, which is used for carrying an LED chip. The submount for an LED includes a silicon substrate and a reflective layer. The silicon substrate has a recess with an arc-shaped sidewall. The reflective layer covers on the arc-shaped sidewall.

In an embodiment of the present invention, the arc-shaped sidewall has a continuous curved surface or is formed of a plurality of annular structures.

In an embodiment of the present invention, the arc-shaped sidewall has a rough surface.

In an embodiment of the present invention, a material of the reflective layer includes a metal.

In view of the above, according to the submount for an LED and the method for fabricating the same of the present invention, by forming the silicon oxide layer in the silicon substrate first and then removing the silicon oxide layer, the recess with the arc-shaped sidewall is formed in the silicon substrate without being limited to the lattice direction of the silicon substrate. In this manner, when applied in the LED package structure, the submount for an LED facilitates to reduce the light loss, so the light-emitting luminance and light-emitting efficiency of the LED are improved, and the light shape is adjusted.

In order to make the aforementioned and other objectives and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
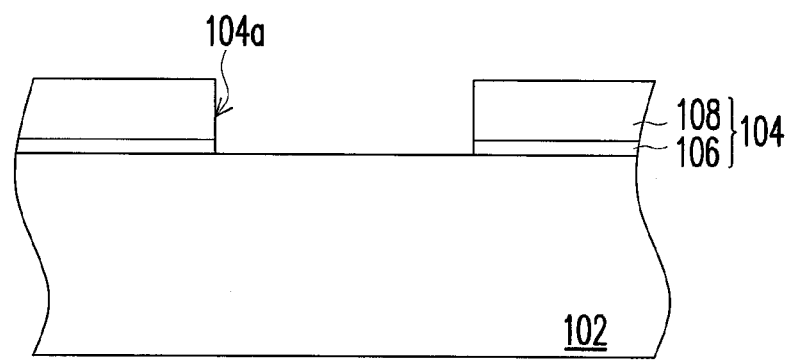
FIG. 1A to FIG. 1H are schematic cross-sectional views illustrating a method for fabricating a submount for an LED according to a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1A to FIG. 1H are schematic cross-sectional views illustrating a method for fabricating a submount for an LED according to a first embodiment of the present invention. FIG. 2 is a schematic three-dimensional view illustrating a recess in the structure of the submount for the LED in FIG. 1H, wherein a reflective layer and an LED chip are omitted.

Figure 2:
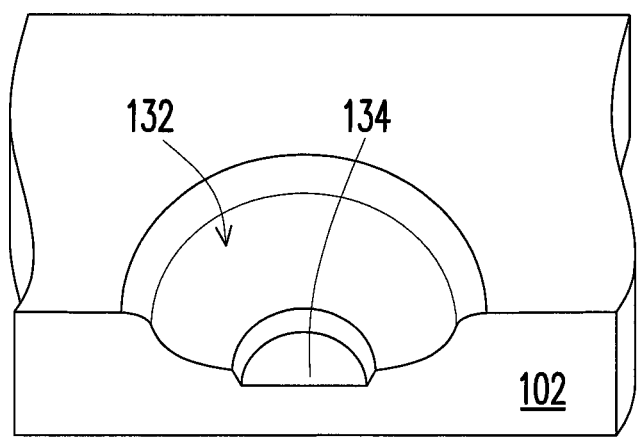
FIG. 2 is a schematic top view illustrating a recess in the structure of the submount for the LED in FIG. 1H.

Referring to FIG. 1A, a silicon substrate 102 is provided and a mask layer 104 is formed on the silicon substrate 102. The mask layer 104 has an opening 104a that exposes a part of a surface of the silicon substrate 102, so as to define an area where the recess is to be formed subsequently. In the embodiment, the mask layer 104 includes a pad oxide layer 106 and a silicon nitride layer 108. The pad oxide layer 106 is located between the silicon substrate 102 and the silicon nitride layer 108 to increase the adhesion between the silicon nitride layer 108 and the silicon substrate 102. The pad oxide layer 106 may be formed by adopting a thermal oxidation method, and the silicon nitride layer 108 may be formed through chemical vapor deposition (CVD). The mask layer 104 may be formed by, for example, forming the pad oxide layer, the silicon nitride layer, and a patterned photoresist layer (not shown) in sequence on the silicon substrate 102 first and then performing an etching process with the patterned photoresist layer as a mask to pattern the pad oxide layer and the silicon nitride layer to form the opening 104a and then remove the patterned photoresist layer.

Figure 1B:
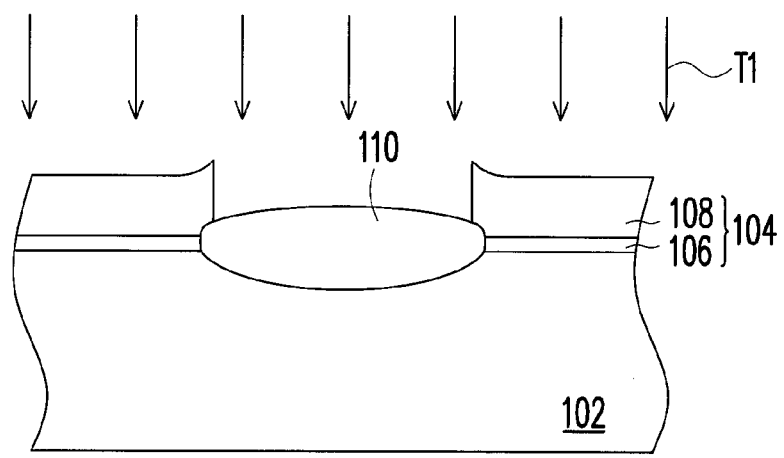

Referring to FIG. 1B, the silicon oxide layer 110 is formed in the part of the silicon substrate 102 which is exposed. The silicon oxide layer 110 may be formed by, for example, performing a thermal oxidation process T1 to oxidize the surface of the silicon substrate 102 which is not covered by the mask layer 104 (that is, the surface of the silicon substrate 102 exposed by the opening 104a), and the oxide generated in the opening 104a serves as the silicon oxide layer 110. The thermal oxidation process T1 is, for example, a local oxidation of silicon (LOCOS) process.

It should be noted here that the oxide generated through the LOCOS technology is subject to the oxidation to different extents and a curved junction is formed between the silicon oxide layer 110 and the silicon substrate 102 (as shown in FIG. 1B), for example. Furthermore, since the oxygen molecule at the edge of the mask layer 104 may be diffused in the horizontal direction, the silicon substrate 102 under the edge of the mask layer 104 may generate the oxide, which results in that the edge of the mask layer 104 tilts upwards under the stress to form the so-called structure of a bird's beak eventually.

Figure 1C:
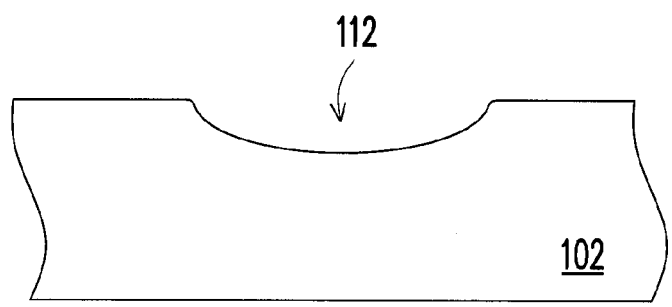

Referring to FIG. 1C, the mask layer 104 and the silicon oxide layer 110 are removed to form the recess 112 in the silicon substrate 102. In an embodiment, the mask layer 104 and the silicon oxide layer 110 are removed, for example, by performing a wet etching process first to remove the silicon nitride layer 108 and then performing another wet etching process to remove the pad oxide layer 106 and the silicon oxide layer 110 at the same time. In the above process of removing the silicon nitride layer 108, phosphoric acid may be used as the etchant. In the process of removing the pad oxide layer 106 and the silicon oxide layer 110, a buffer oxide etchant (BOE) or a diluted hydrofluoric acid (DHF) may be used as the etchant.

It should be noted that when the silicon substrate is etched directly with the etchant such as KOH instead of the LOCOS technology to form the recess, usually, due to the lattice direction of the silicon material, the sidewall of the recess formed by etching has a slanted plane at a fixed angle, so the shape and structure of the recess is greatly limited and cannot be formed to be an approximately circular or curved recess. However, in the embodiment of the present invention, the interface between the silicon oxide layer 110 formed by the LOCOS and the silicon substrate 102 has an arc shape, so the recess 112 formed after the silicon oxide layer 110 is removed correspondingly has an arc-shaped sidewall, and the shape of the recess may be designed according to the requirements without being limited to the lattice direction.

Furthermore, by properly selecting a thicknesses ratio between the pad oxide layer 106 and the silicon nitride layer 108 and adjusting the oxidation time and oxidation temperature, the extent that the structure of the bird's beak is formed at the edge of the silicon oxide layer 110 may be controlled, thereby achieving the effect of adjusting the slope or the curvature of the sidewall of the recess 112.

In an embodiment, to form a recess with a greater depth or with a larger slope or a large curvature of the sidewall in the silicon substrate 102, after the recess 112 is formed, the processes similar to those in FIG. 1A to FIG. 1C may be selectively repeated at least once to obtain the recess with the required configuration.

Figure 1D:
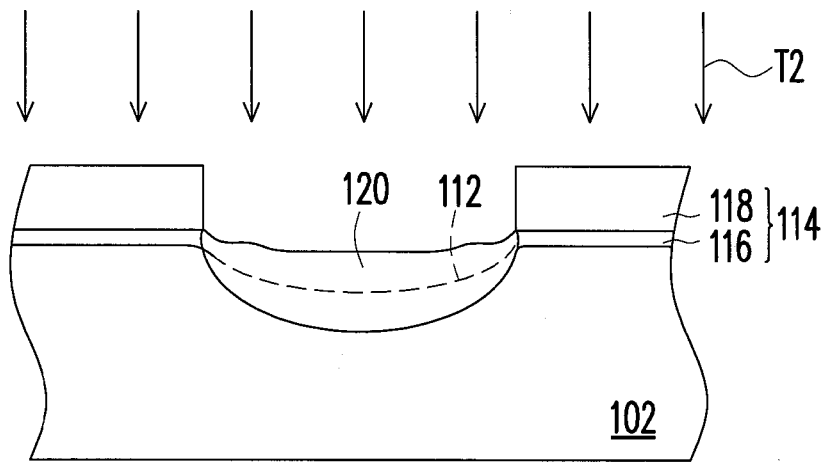

Referring to FIG. 1D, after the recess 112 is performed, the mask layer 114 is formed on the silicon substrate 102 again, and the mask layer 114, for example, exposes the surface of the silicon substrate 102 located at the recess 112. In an embodiment, the range of the silicon substrate 102 exposed by the mask layer 114 is substantially identical to the range of the silicon substrate 102 exposed by the mask layer 104 in FIG. 1A, for example. Furthermore, the material of the mask layer 114 is, for example, similar or identical to that of the mask layer 104, and includes a pad oxide layer 116 and a silicon nitride layer 118.

Subsequently, a thermal oxidation process T2 is performed to oxidize the surface of the silicon substrate 102 that is not covered by the mask layer 114, and the silicon oxide layer 120 is formed in the previous recess 112. In this embodiment, the thermal oxidation process T2 is, for example, performed through the LOCOS technology. Likewise, the interface between the silicon oxide layer 120 formed through the LOCOS and the silicon substrate 102 has an arc shape and the structure of the bird's beak may be generated at the edge of the silicon oxide layer 120.

Figure 1E:
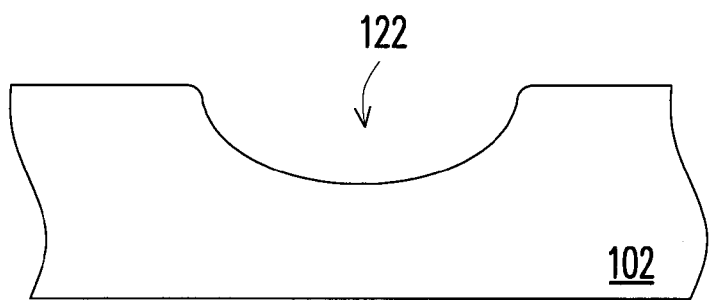

Referring to FIG. 1E, the mask layer 114 and the silicon oxide layer 120 are removed to form the recess 122 in the silicon substrate 102. In an embodiment, the method of removing the mask layer 114 and the silicon oxide layer 120 may be similar or identical to the method of removing the mask layer 104 and the silicon oxide layer 110 in FIG. 1C, so the details are omitted here. Since the silicon oxide layer 120 formed through the LOCOS may also be formed in the substrate 102 (as shown in FIG. 1D) at the recess 112, and the recess 122 formed after removing the silicon oxide layer 120 is, for example, substantially located at the recess 112 formed in FIG. 1C. The difference between the two recesses lies in that the recess 122 is deeper, and the slope or the curvature of the sidewall may be greater.

Figure 1F:
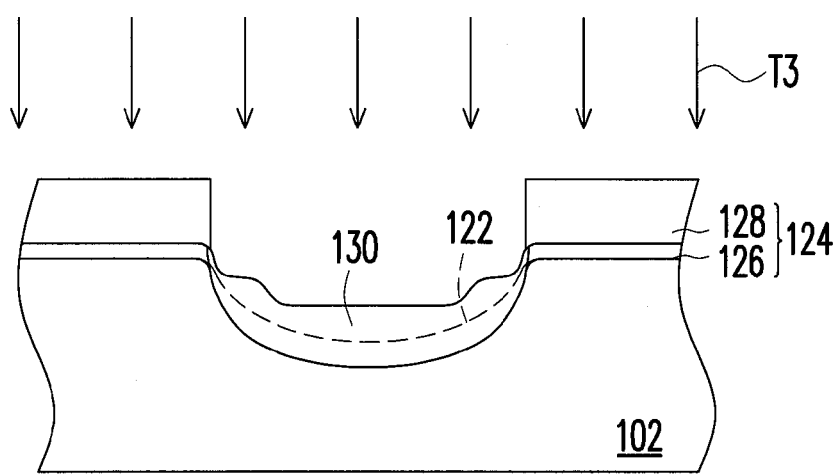

Referring to FIG. 1F, a mask layer 124 is formed on the silicon substrate 102 again to expose the surface of the silicon substrate 102 located at the recess 122. In an embodiment, the range of the silicon substrate 102 exposed by the mask layer 124 is substantially identical to the range of the silicon substrate 102 exposed by the mask layers 104, 114 as shown in FIG. 1A and FIG. 1D. Furthermore, the material of the mask layer 124 is, for example, similar or identical to that of the mask layer 104, and includes a pad oxide layer 126 and a silicon nitride layer 128. Subsequently, a thermal oxidation process T3 is performed to oxidize the surface of the silicon substrate 102 that is not covered by the mask layer 124, and the silicon oxide layer 130 is formed at the previous recess 122. The thermal oxidation process T3 is, for example, performed through the LOCOS technology.

Figure 1G:
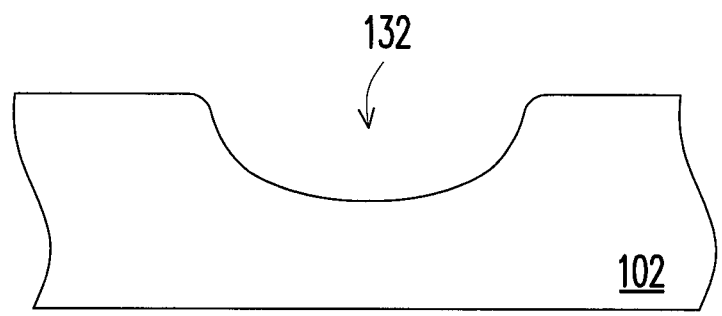

Referring to FIG. 1G, the mask layer 124 and the silicon oxide layer 130 are removed, and the recess 132 is formed in the silicon substrate 102. In this manner, the recess 132 formed after removing the silicon oxide layer 130 is, for example, substantially located at the previously formed recess 122, but the recess 132 is deeper, and the slope or the curvature of the sidewall may be greater. In an embodiment, the method of removing the mask layer 124 and the silicon oxide layer 130 may be similar or identical to the method of removing the mask layer 104 and the silicon oxide layer 110 as shown in FIG. 1C.

It should be noted here that although in the above embodiment, for example, the LOCOS and the wet etching process are performed three times to form the recess 132 in the silicon substrate 102, the number of times of repeating the LOCOS and the wet etching process may be determined according to the configuration of the required recess in the end. As shown in FIG. 1G and FIG. 2, in this embodiment, the recess 132 formed eventually, for example, has an arc-shaped sidewall, and the arc-shaped sidewall may have a continuous curved surface.

Figure 1H:
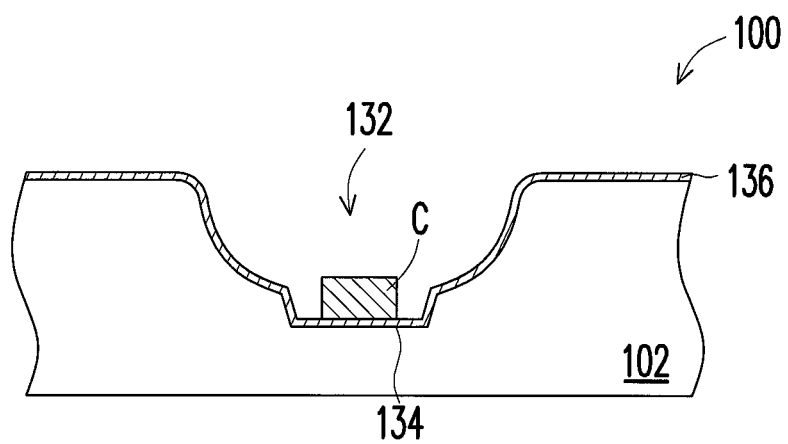

Furthermore, to configure the LED chip in the recess and finish the LED package structure, it is better that the bottom of the recess has a planar surface to facilitate the placement of the LED chip. Referring to FIG. 1H, after the recess 132 is formed, a planar surface is selectively formed at the bottom of the recess 132. Specifically, the method of forming the planar surface at the bottom of the recess 132 includes the following steps. First, a mask layer (not shown) is formed on the substrate 102 and the mask layer at least exposes an area where the LED chip is to be placed subsequently. A wet etching process is performed to remove a part of the substrate 102 which is exposed, and a recessed portion 134 with the planar surface is formed at the bottom of the recess 132. Next, the mask layer is removed. In an embodiment, the material of the mask layer is, for example, silicon nitride, and the KOH is used as the etchant in the wet etching process, so the recessed portion 134 formed by etching has the desired planar surface due to the silicon lattice direction. In another embodiment, if, after the required recess (for example, the recess 132) is fabricated, the bottom of the recess has a planar surface, so the steps of forming the recessed portion 134 may be omitted.

Subsequently, a reflective layer 136 is formed on the sidewall of the recess 132 and the recessed portion 134. The reflective layer 136 covers, for example, on the entire surface of the substrate 102 in a conformal manner. Since the reflective layer 136 has an excellent reflectivity, the light loss of the LED to be packaged subsequently may be reduced and thus the light extraction efficiency is improved. The material of the reflective layer 136 is, for example, a metal, such as gold, silver or aluminum-based copper, and may be formed through a sputtering process. So far, the fabrication of the submount for an LED 100 is substantially finished. Subsequently, the LED chip C is selectively disposed on the planar surface of the recessed portion 134, and the subsequent packaging steps are performed to apply the submount for an LED 100 in the LED package structure.

Figure 3A:
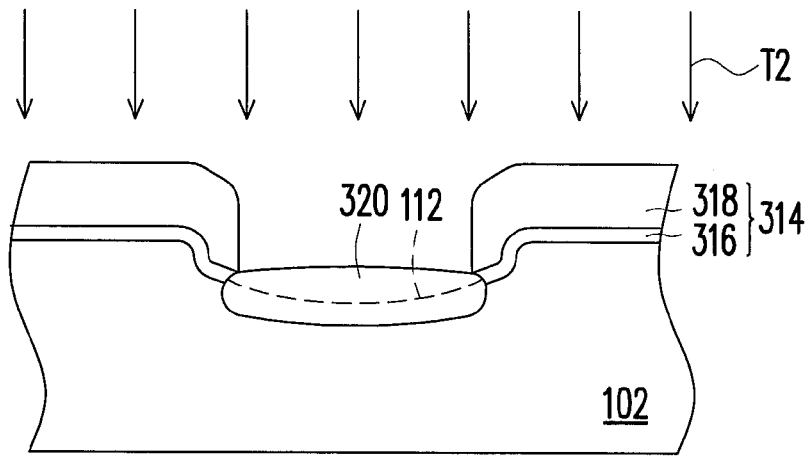
FIG. 3A to FIG. 3E are schematic cross-sectional views illustrating a method for fabricating a submount for an LED according to a second embodiment of the present invention.

FIG. 3A to FIG. 3E are schematic cross-sectional views illustrating a method for fabricating a submount for an LED according to a second embodiment of the present invention. The fabrication steps in FIG. 3A are subsequent to steps in FIG. 1C, and the same members are indicated by the same reference numerals and the illustration of the members is omitted. FIG. 4 is a schematic three-dimensional view illustrating a recess in the structure of the submount for the LED in FIG. 3E, wherein the reflective layer and the LED chip are omitted.

Referring to FIG. 3A, after the recess 112 is formed, a mask layer 314 is formed on the silicon substrate 102 again, and the mask layer 314, for example, exposes a part of the surface of the silicon substrate 102 located at the recess 112. In an embodiment, the range of the silicon substrate 102 exposed by the mask layer 314 is, for example, smaller than the range of the silicon substrate 102 exposed by the mask layer 104 in FIG. 1A. In other words, the mask layer 314 covers on a part of the surface of the silicon substrate 102 located at the recess 112. Furthermore, the material of the mask layer 314 is, for example, similar or identical to that of the mask layer 104 and includes a pad oxide layer 316 and a silicon nitride layer 318.

Subsequently, a thermal oxidation process T2 is performed to oxidize the surface of the silicon substrate 102 that is not covered by the mask layer 314, and the silicon oxide layer 320 is formed in the previous recess 112. In this embodiment, the thermal oxidation process T2 is, for example, performed through the LOCOS technology.

Figure 3B:
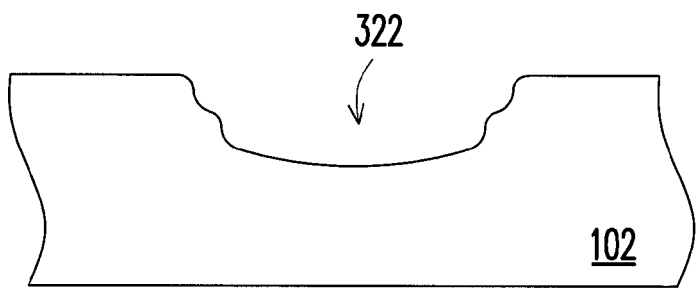
Figure 4:
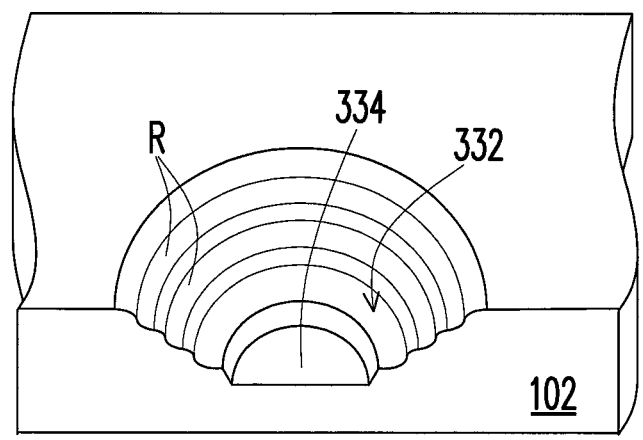
FIG. 4 is a schematic top view illustrating a recess in the structure of the submount for the LED in FIG. 3E.

Referring to FIG. 3B, the mask layer 314 and the silicon oxide layer 320 are removed to form the recess 322 in the silicon substrate 102. In this manner, the position of the recess 322 formed by removing the silicon oxide layer 320 is, for example, within the range of the previously formed recess 112, and the recess 322 is deeper. In an embodiment, the method of removing the mask layer 314 and the silicon oxide layer 320 may be similar or identical to the method of removing the mask layer 104 and the silicon oxide layer 110 in FIG. 1C, so the details are omitted here.

Figure 3C:
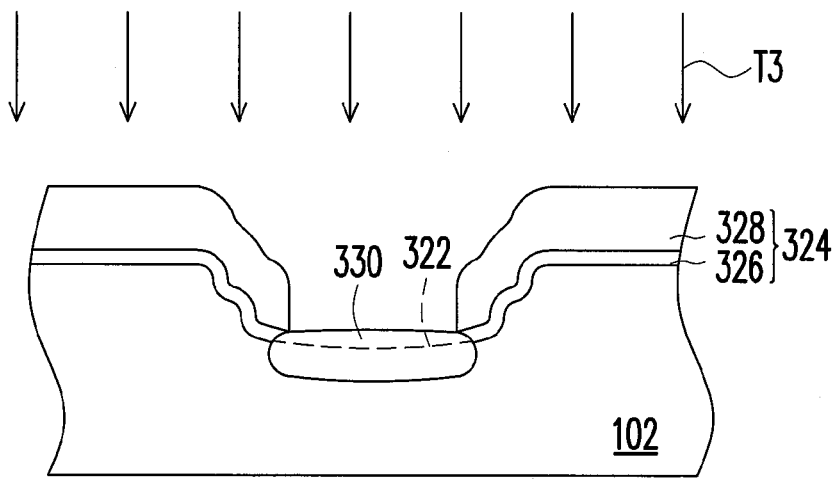

Referring to FIG. 3C, a mask layer 324 is formed on the silicon substrate 102 again to expose a part of the surface of the silicon substrate 102 located at the recess 322. In an embodiment, the range of the silicon substrate 102 exposed by the mask layer 324 is, for example, smaller than the range of the silicon substrate 102 exposed by the mask layer 314 as shown in FIG. 3A, that is, the mask layer 324 covers on a part of the surface of the silicon substrate 102 located at the recess 322. Furthermore, the material of the mask layer 324 is, for example, similar or identical to that of the mask layer 104 and includes a pad oxide layer 326 and a silicon nitride layer 328.

Subsequently, a thermal oxidation process T3 is performed to oxidize the surface of the silicon substrate 102 that is not covered by the mask layer 324, and the silicon oxide layer 330 is formed in the previous recess 322. The thermal oxidation process T3 is, for example, performed through the LOCOS technology.

Figure 3D:
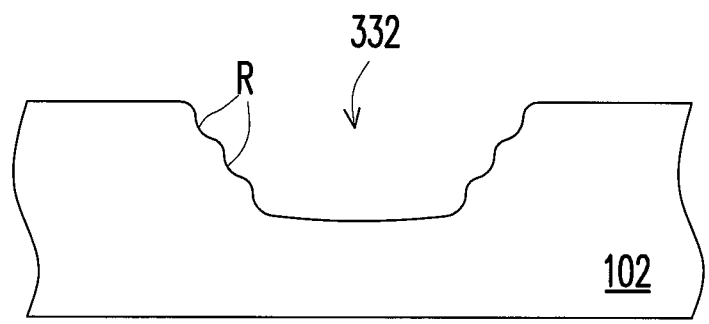

Referring to FIG. 3D, the mask layer 324 and the silicon oxide layer 330 are removed to form the recess 332 in the silicon substrate 102. In this manner, the position of the recess 332 formed by removing the silicon oxide layer 330 is, for example, within the range of the previously formed recess 322, and the recess 332 is deeper. In an embodiment, the method of removing the mask layer 324 and the silicon oxide layer 330 may be similar or identical to the method of removing the mask layer 104 and the silicon oxide layer 110 in FIG. 1C.

Figure 3E:
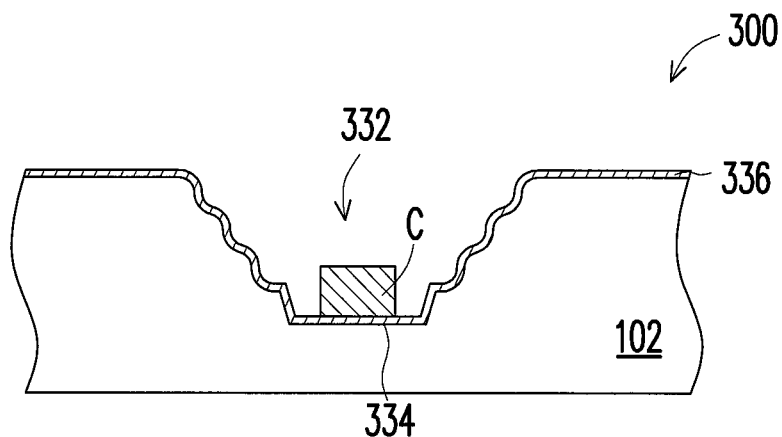

Referring to FIG. 3E, after the recess 332 is formed, the planar surface is selectively formed at the bottom of the recess 332. The method of forming the planar surface at the bottom of the recess 332 may adopt, for example, the method in FIG. 1H, wherein the wet etching process is performed with the KOH as the etchant to form the recessed portion 334 with the planar surface at the bottom of the recess 332. In another embodiment, if the bottom of the recess 332 is the planar surface, steps of forming the recessed portion 334 may be omitted.

Subsequently, a reflective layer 336 is formed on the sidewall of the recess 332 and the recessed portion 334, and the reflective layer 336 covers, for example, on the entire surface of the substrate 102 in a conformal manner, thus substantially finishing the fabrication of the submount for an LED 300. Next, the LED chip C is selectively disposed on the planar surface of the recessed portion 334, and the subsequent packaging steps are performed to apply the submount for an LED 300 in the LED package structure.

As shown in FIG. 3D and FIG. 4, in this embodiment, by gradually reducing the area covered by the mask layer used in the thermal oxidation process to be smaller than the area covered by the previous mask layer, the depth of the recess is increased and the contour of the recess formed eventually may have a plurality of annular structures R. In this embodiment, the recess 332 formed eventually has, for example, an arc-shaped sidewall and the arc-shaped sidewall may be formed of a plurality of annular structures R.

Figure 5A:
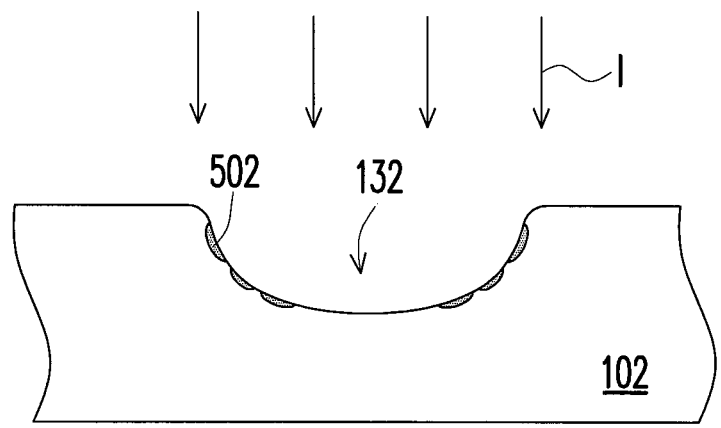
FIG. 5A to FIG. 5D are schematic cross-sectional views illustrating a method for fabricating a submount for an LED according to a third embodiment of the present invention.

FIG. 5A to FIG. 5D are schematic cross-sectional views illustrating a method for fabricating a submount for an LED according to a third embodiment of the present invention. The fabrication steps in FIG. 5A are subsequent to the steps in FIG. 1G, and the same components are indicated by the same reference numerals and the illustration of the components is omitted. FIG. 6 is a schematic three-dimensional view illustrating a recess in the structure of the submount for the LED in FIG. 5D, wherein the reflective layer and the LED chip are omitted.

Referring to FIG. 5A, after the recess 132 is formed, an ion implantation process I is performed to form a plurality of implantation regions 502 in a part of the sidewall of the recess 132. In an embodiment, the ion implantation process I, for example, implants oxygen ions in the substrate 102. Furthermore, the ion implantation process I may be used together with a patterned photoresist to define the implantation area and vertical implantation or inclined implantation is performed in the area exposed by the patterned photoresist.

Figure 5B:
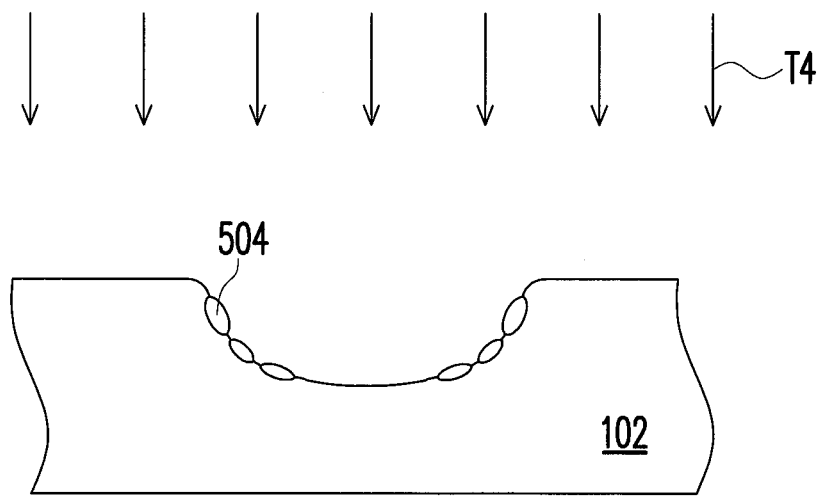
Figure 6:
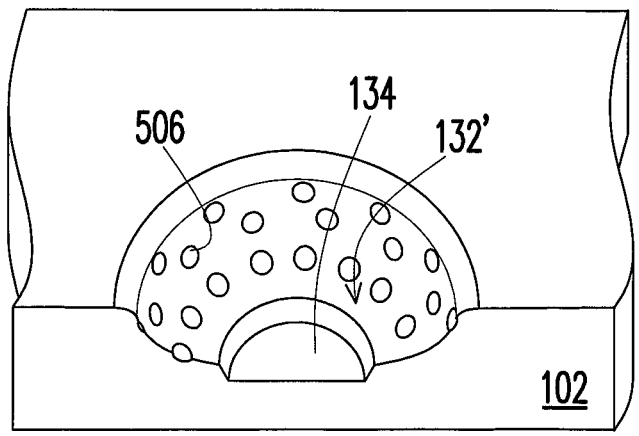
FIG. 6 is a schematic top view illustrating a recess in the structure of the submount for the LED in FIG. 5D.

Referring to FIG. 5B, a thermal process T4 is performed to form the silicon oxide layer 504 in the implantation area 502.

When the thermal process T4 is performed, the implantation area 502 implanted with the oxygen ions generates the oxide more easily as compared with a part of the substrate 102 where the oxygen ions are not implanted. Therefore, by controlling a reaction temperature and a reaction time of the thermal process T4, the silicon oxide layer 504 may be formed at the implantation area 502 only. In an embodiment, the thermal process T4 is, for example, an oxygen-free thermal process.

Figure 5C:
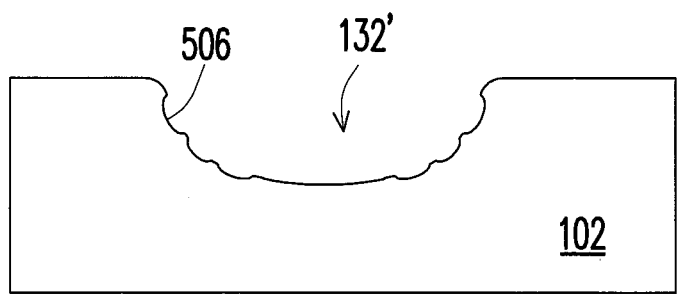

Referring to FIG. 5C, the silicon oxide layer 504 is removed to form holes 506 on the sidewall of the recess 132. The method of removing the silicon oxide layer 504 is, for example, the wet etching process, wherein the buffer oxide etchant (BOE) or the diluted hydrofluoric acid (DHF) may be used as the etchant. In this embodiment, the recess 132' formed eventually has, for example, the arc-shaped sidewall, and the holes 506 are formed on the arc-shaped sidewall to result in a rough surface.

Figure 5D:
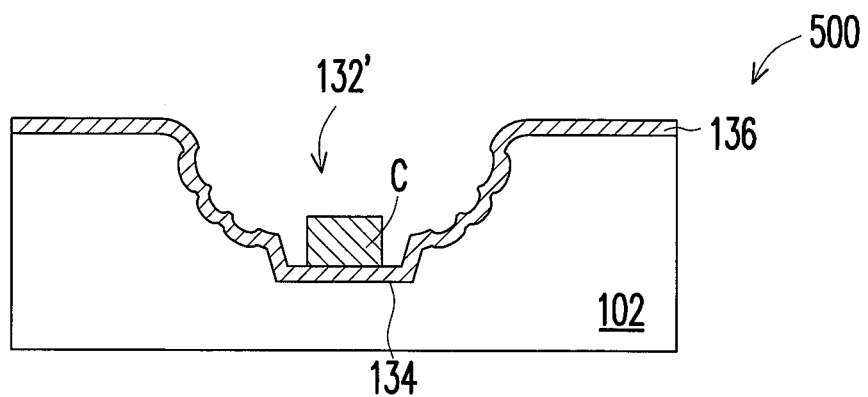

Referring to FIG. 5D, after the recess 132' is formed, similarly, the recessed portion 134 with the planar surface may be selectively formed at the bottom of the recess 132'. Subsequently, the reflective layer 136 is formed on the sidewall of the recess 132' and the recessed portion 134, and the reflective layer 136 covers, for example, on the entire surface of the substrate 102 in a conformal manner, so the fabrication of the submount for an LED 500 is substantially finished.

As shown in FIG. 5C and FIG. 6, in this embodiment, after the major part of the recess is substantially formed, the ion implantation process I and the thermal process T4 are performed in sequence to form the silicon oxide layer 504 in the implantation area 502. Therefore, after the silicon oxide layer 504 is removed, the holes 506 can be formed, so that the arc-shaped sidewall of the recess 132' formed eventually has a rough surface. Furthermore, the shape of the arc-shaped recess is not limited to the lattice direction of the silicon material, and further the holes 506 may have the arc-shaped contour according to the requirement without being limited to the lattice direction.

It should be noted that in the above three embodiments, for example, the process of removing the silicon oxide layer formed through the thermal oxidation process is repeated several times, but the present invention is not limited thereto. Persons skilled in the art should understand that the present invention may adopt the LOCOS and the ion implantation technology together to control the forming position, depth and curvature of the silicon oxide layer to determine the recess contour after the silicon oxide layer is removed, so as to obtain the recess having the desired arc-shaped sidewall. In this manner, when the submount for an LED having the above recess is applied in the LED packaging, the light emitted by the LED chip is effectively controlled to reduce the light loss and the light shape may be adjusted according to the requirement to further improve the luminance and the light-emitting efficiency.

Hereinafter, the structure of the submount for an LED of the present invention is illustrated by taking FIG. 1H, FIG. 3E and FIG. 5D as an example. Referring to FIG. 1G, FIG. 3E and FIG. 5D, the submounts for an LED 100, 300, 500 respectively include a silicon substrate 102 and reflective layers 136, 336, which are used for carrying the LED chip C. The silicon substrate 102 in the submounts for an LED 100, 300, 500 respectively have recesses 132, 332, 132', and the recesses 132, 332, 132' have the arc-shaped sidewall. The reflective layers 136, 336 respectively cover on the arc-shaped sidewalls of the recesses 132, 332, 132'.

As shown in FIG. 1G and FIG. 2, in an embodiment, the arc-shaped sidewall of the recess 132 may have a continuous curved surface. In an embodiment, as shown in FIG. 3E and FIG. 4, the arc-shaped sidewall of the recess 332 may be formed of a plurality of annular structures R. In an embodiment, as shown in FIG. 5D and FIG. 6, the arc-shaped sidewall of the recess 132' is, for example, formed with holes 506 to result in a rough surface.

In view of the above, according to the submount for an LED and the method for fabricating the same of the present invention, the thermal oxidation process is used to form the silicon oxide layer in the silicon substrate. Next, the silicon oxide layer is removed to form the recess with the arc-shaped sidewall in the silicon substrate, so the configuration of the recess may be designed according to the requirements without being limited to the lattice direction of the silicon material. Furthermore, by controlling the structure of the bird's beak formed through the LOCOS technology or additionally performing the ion implantation process, the desired recess contour may be adjusted easily. Therefore, when the submount for an LED of the present invention is used to carry the LED chip, the luminance and light-emitting efficiency of the LED may be increased and the light shape may be adjusted according to the requirement.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a submount for a light emitting diode (LED), comprising:
    (a) providing a silicon substrate;
    (b) forming a mask layer on the silicon substrate to expose a part of the silicon substrate;
    (c) forming a first silicon oxide layer in the part of the silicon substrate which is exposed; and
    (d) removing the mask layer and the first silicon oxide layer, so as to form a recess in the silicon substrate to form said submount for said light emitting diode.

2. The method for fabricating the submount for the LED according to claim 1, wherein the mask layer comprises a pad oxide layer and a silicon nitride layer, and the pad oxide layer is for med between the silicon substrate and the silicon nitride layer.

3. The method for fabricating the submount for the LED according to claim 2, wherein a slope or a curvature of a sidewall of the recess is adjusted by controlling a thicknesses ratio between the pad oxide layer and the silicon nitride layer.

4. The method for fabricating the submount for the LED according to claim 2, wherein the step (d) comprises:
    removing the silicon nitride layer; and
    removing the pad oxide layer and the first silicon oxide layer.

5. The method for fabricating the submount for the LED according to claim 1, after the step (d), further comprising repeating the step (b) to the step (d) at least once.

6. The method for fabricating the submount for the LED according to claim 5, wherein when the step (b) is repeated, a range of the part of the silicon substrate exposed by the mask layer is substantially identical to a range of the part of the silicon substrate exposed by the mask layer in the step (b) that is performed last time.

7. The method for fabricating the submount for the LED according to claim 5, wherein when the step (b) is repeated, a range of the part of the silicon substrate exposed by the mask layer contracts towards a center of the recess as compared with a range of the part of the silicon substrate exposed by the mask layer in the step (b) that is performed last time.

8. The method for fabricating the submount for the LED according to claim 1, wherein the step (c) comprises performing a thermal oxidation process to oxidize the silicon substrate that is not covered by the mask layer.

9. The method for fabricating the submount for the LED according to claim 1, after the step (d), further comprising:
    performing an ion implantation process to form a plurality of implantation regions in a part of a sidewall of the recess;
    performing a thermal process to form a plurality of second silicon oxide layers in the implantation regions; and
    removing the second silicon oxide layers to form a plurality of holes on the sidewall of the recess.

10. The method for fabricating the submount for the LED according to claim 9, wherein the ion implantation process comprises an oxygen ion implantation process.

11. The method for fabricating the submount for the LED according to claim 9, wherein the thermal process comprises an oxygen-free thermal process.

12. The method for fabricating the submount for the LED according to claim 1, after the step (d), further comprising forming a planar surface at a bottom of the recess.

13. The method for fabricating the submount for the LED according to claim 1, after the step (d), further comprising forming a reflective layer on a surface of the silicon substrate in a conformal manner.

14. The method for fabricating the submount for the LED according to claim 13, wherein a material of the reflective layer comprises a metal.

* * * * *